(12) United States Patent
Adusumilli et al.

(10) Patent No.: US 9,997,590 B2
(45) Date of Patent: Jun. 12, 2018

(54) FINFET RESISTOR AND METHOD TO FABRICATE SAME

(71) Applicant: International Business Machines Corporation, Armonk, NY (US)

(72) Inventors: Praneet Adusumilli, Albany, NY (US); Keith E. Fogel, Hopwell Junction, NY (US); Alexander Reznicek, Troy, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/331,998

(22) Filed: Oct. 24, 2016

(65) Prior Publication Data

US 2018/0114826 A1 Apr. 26, 2018

(51) Int. Cl.
| | |
|---|---|
| *H01L 49/02* | (2006.01) |
| *H01L 27/08* | (2006.01) |
| *H01L 29/78* | (2006.01) |
| *H01L 27/12* | (2006.01) |

(52) U.S. Cl.
CPC .......... *H01L 28/24* (2013.01); *H01L 27/0802* (2013.01); *H01L 27/1211* (2013.01); *H01L 29/785* (2013.01)

(58) Field of Classification Search
CPC ........................... H01L 27/1211; H01L 29/785
See application file for complete search history.

(56) References Cited

U.S. PATENT DOCUMENTS

| | | | |
|---|---|---|---|
| 6,720,231 B2 | 4/2004 | Fried et al. | |
| 6,977,837 B2 * | 12/2005 | Watanabe | ............ G11C 11/412 |
| | | | 365/156 |
| 7,064,413 B2 | 6/2006 | Fried et al. | |
| 8,816,436 B2 | 8/2014 | Cheng et al. | |
| 8,836,032 B2 | 9/2014 | Xia et al. | |
| 8,889,508 B2 | 11/2014 | Yeh et al. | |
| 8,962,421 B2 | 2/2015 | Srinivasan et al. | |
| 9,305,974 B1 * | 4/2016 | Liu | ..................... H01L 27/2436 |
| 2004/0159910 A1 | 8/2004 | Fried et al. | |
| 2005/0093074 A1 | 5/2005 | Anderson | |
| 2012/0009749 A1 | 1/2012 | Tan | |
| 2014/0308785 A1 | 10/2014 | Yeh et al. | |
| 2015/0061076 A1 | 3/2015 | Cheng et al. | |
| 2015/0171074 A1 | 6/2015 | Yang et al. | |
| 2016/0190120 A1 | 6/2016 | Singh | |

* cited by examiner

*Primary Examiner* — Lex Malsawma
*Assistant Examiner* — Xia Cross
(74) *Attorney, Agent, or Firm* — Harrington & Smith

(57) ABSTRACT

A method includes providing a semiconductor substrate having a plurality of linear semiconductor fin structures spaced apart from one another on a surface of the substrate; siliciding sidewalls of the semiconductor fin structures; removing an unsilicided central portion of each semiconductor fin structure leaving, for a given one of the semiconductor fin structures, a pair of silicide fin structures that are parallel to one another and spaced apart from one another by a distance about equal to a width of the removed unsilicided central portion of the semiconductor fin structure; and forming contacts to conductively connect together a plurality of the silicide fin structures to form a resistor. A resistance value of the resistor is related at least to a type of silicide, a number of contacted adjacent silicide fin structures and a length between two contacts.

12 Claims, 12 Drawing Sheets

US 9,997,590 B2

FINFET RESISTOR AND METHOD TO FABRICATE SAME

TECHNICAL FIELD

The various embodiments of this invention relate generally to semiconductor devices, to integrated circuit fabrication techniques and, more specifically, to passive devices such as resistors that are fabricated as part of an integrated circuit in conjunction with active devices such as, for example, metal oxide semiconductor field effect transistors (MOSFETs).

BACKGROUND

Passive devices, such as resistors, are important components in integrated circuits when combined with active devices including transistors (e.g., MOSFETs, such as those fabricated as FinFETs). Front-end-of-the-line (FEOL) resistors are normally created with either active material (e.g., Si/SiGe), gate material (doped polysilicon) or metal. The FEOL is typically an initial stage of IC fabrication where individual devices (transistors, capacitors, resistors, etc.) are patterned in the semiconductor material. Different resistivity resistors are typically needed using, e.g., polysilicon (poly) resistors, metal resistors and diffusion resistors. An ability to accurately set (tune) the resistance value depending on the end application is highly desirable. Also highly desired is an ability to provide resistors having a minimal footprint/space requirement while accurately providing the desired resistance values.

SUMMARY

In a first aspect thereof the embodiments of this invention provide a method that comprises providing a semiconductor substrate comprising a plurality of linear semiconductor fin structures spaced apart from one another on a surface of the substrate; siliciding sidewalls of the semiconductor fin structures; removing an unsilicided central portion of each semiconductor fin structure leaving, for a given one of the semiconductor fin structures, a pair of silicide fin structures that are parallel to one another and spaced apart from one another by a distance about equal to a width of the removed unsilicided central portion of the semiconductor fin structure; and forming contacts to conductively connect together a plurality of the silicide fin structures to form a resistor.

In another aspect thereof the embodiments of this invention provide a method that comprises providing a semiconductor substrate comprising a plurality of linear semiconductor fin structures spaced apart from one another on a surface of the substrate; depositing a layer comprised of metal on the sidewalls of the semiconductor fin structures; performing an anneal to react the metal of the metal layer with underlying semiconductor material so as to convert semiconductor material on the sidewalls of the semiconductor fin structures to a silicide having a predetermined value of resistance;

removing unreacted metal; removing an unsilicided central portion of each semiconductor fin structure leaving, for a given one of the semiconductor fin structures, a pair of silicide fin structures that are parallel to one another and spaced apart from one another by a distance about equal to a width of the removed unsilicided central portion of the semiconductor fin structure; depositing a dielectric layer over pairs of silicide fin structures; opening contact trenches in the dielectric layer at predetermined locations; and forming contacts to conductively connect together a plurality of the silicide fin structures to form a resistor.

In yet another aspect thereof the embodiments of this invention provide a structure that comprises a substrate having a top surface; a dielectric layer disposed on the top surface; and an array of linear resistive silicide fin structures extending upwardly perpendicular to the top surface and overlying a portion of a top surface of the dielectric layer. In the structure individual ones of the linear resistive silicide fin structures are disposed parallel to one another and where two adjacent linear resistive silicide fin structures also overly a portion of a Si fin stump that is disposed in and surrounded by the dielectric layer on the top surface of the substrate.

BRIEF DESCRIPTION OF THE SEVERAL VIEWS OF THE DRAWINGS

FIG. 1 shows what can be referred to as a starting or initial structure comprised of a semiconductor (e.g., Si) substrate having a plurality of Si fins formed on a top surface thereof, hard mask (HM) caps on the tops of the fins, and a layer of shallow trench isolation (STI) between the fins;

FIG. 2 shows the structure of FIG. 1 after a metal layer is conformally deposited, where the metal is selected so as to form a desired type of silicide with the fins;

FIG. 3 shows the structure of FIG. 2 after performing a thermal salicidation process to convert at least a portion of that portion of the metal layer that is in contact with the Si sidewalls of the fins to a resistive silicide;

FIG. 4 shows the structure of FIG. 3 after performing a metal strip process to remove any unreacted metal;

FIG. 5 shows the structure of FIG. 4 after performing several processing steps: forming a layer of inter-layer dielectric (ILD), performing an ILD CMP that stops on the top surface of the HM, and removing the HM caps from the tops of the fins;

FIG. 6 shows the structure of FIG. 5 after removal of the remaining portion of the Si fins, leaving fin 'stumps' or 'stubs' and silicide fins (two silicide fins per original Si fin);

FIG. 7 shows the structure of FIG. 6 after additional ILD material is added to fill the voids left by the removal of the remaining portion of the Si fins in FIG. 6;

FIG. 8 is an enlarged top view of a portion of the structure shown in FIG. 7 looking 'through' a top surface of the ILD as though the ILD were not present;

FIG. 9 is an enlarged top view of the portion of the structure shown in FIG. 7 looking down on the top surface of the ILD after contact trenches have been opened through the ILD;

FIG. 10 is an enlarged top view of the portion of the structure shown in FIG. 9 after deposition of a desired contact metal/metal system on those portions of the STI, the Si fin stubs and the resistive suicide fins exposed within the contact trenches;

FIG. 11 is an enlarged cross-sectional view of the portion of the structure shown in FIG. 10, taken along the section line labeled '11' in FIG. 10; and FIG. 12 is an enlarged, simplified top view of some of the structure shown in FIG. 9.

DETAILED DESCRIPTION

Figure 1:
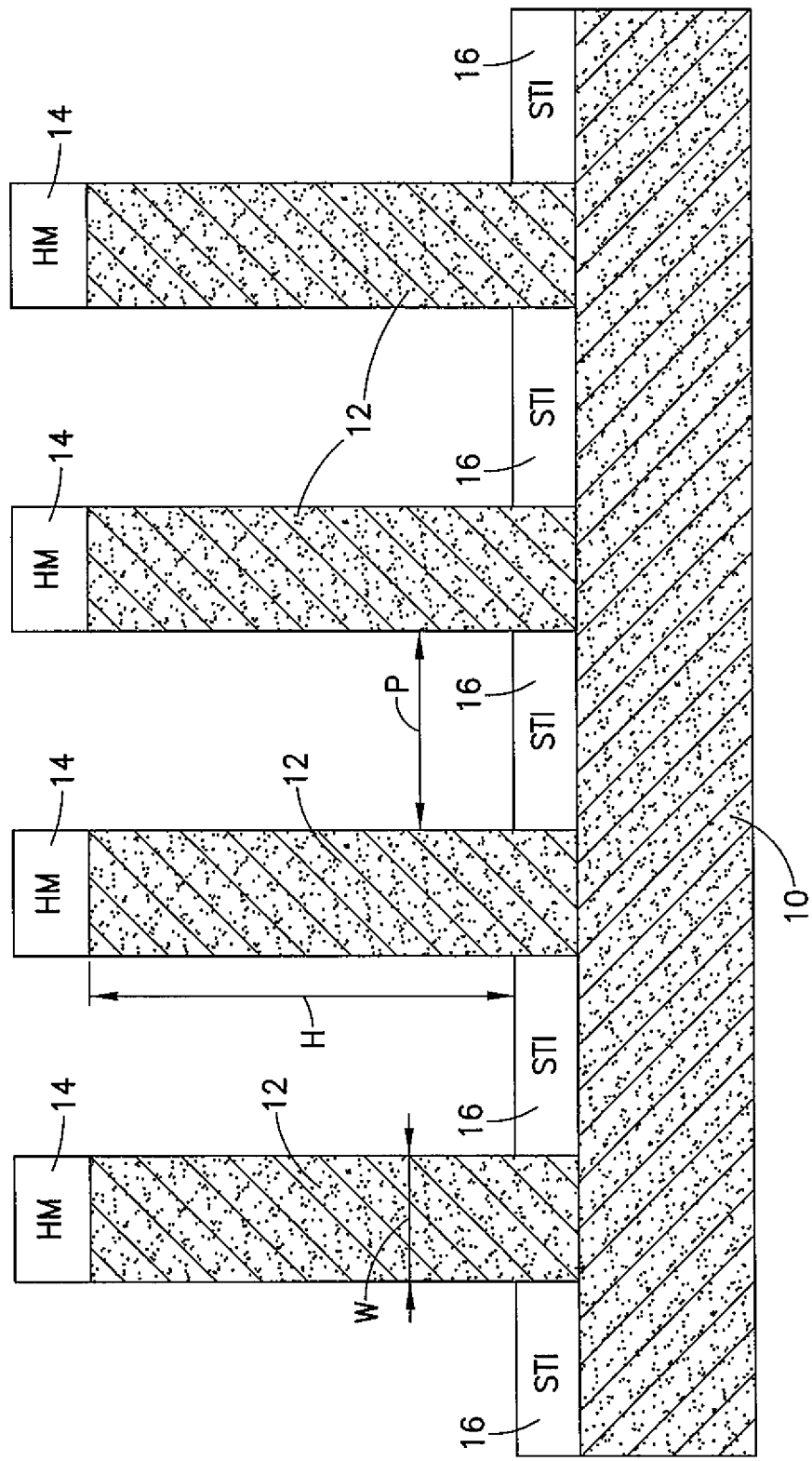
FIGS. 1-7 and 11 are each an enlarged cross-sectional view showing various initial, intermediate and completed or substantially completed structures that are fabricated in accordance with embodiments of this invention, wherein the various layer thicknesses and other dimensions are not necessarily drawn to scale.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface.

Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses and methods that are suitable for use in implementing the embodiments of this invention can include, but are not limited to, chemical vapor deposition (CVD) such as, for example, rapid thermal chemical vapor deposition (RTCVD), atmospheric pressure chemical vapor deposition (APCVD), low pressure chemical vapor deposition (LP-CVD) and ultra-high vacuum chemical vapor deposition (UHVCVD). Other suitable epitaxial growth processes can include, but are not limited to, molecular beam epitaxy (MBE) and low-energy plasma deposition (LEPD). The temperature for an epitaxial deposition process typically ranges from about 300° C. to about 900° C. Although higher temperature will typically result in faster deposition of the semiconductor material, the faster deposition may also result in crystal defects and film cracking.

While the embodiments of this invention will be described below in the context of using a bulk Group IV substrate, e.g., a Si substrate, in at least one embodiment thereof this invention can employ semiconductor-on-insulator (SOI) technology where a thin semiconductor layer, such as a layer of SiGe or a layer of Si, is formed over an insulating layer, such as a layer of silicon oxide ($SiO_2$), which in turn is formed over a (bulk) substrate, such as a Si substrate. The insulating layer can be referred to as a buried oxide (BOX) layer or simply as a BOX. For a single BOX SOI wafer the SOI layer can be divided into active regions by shallow trench isolation (STI) which intersects the BOX and provides total isolation for active device regions formed in the SOI layer. For FinFET type devices the fin structures can be defined in the SOI layer. For transistor fabrication the FET sources and drains can be formed, for example, by ion implantation or diffusion of N-type or P-type dopants into the fins. A FET channel region between a source/drain pair can be created so as to underlie a gate structure. For this invention some of the defined fins can be processed to form resistors, as will be described in detail.

Unless expressly indicated differently any references to a "top surface" herein imply a surface in a direction away from some surface that would support a wafer substrate, while any references to a "bottom surface" imply a surface in a direction towards the surface that would support the wafer substrate.

In non-limiting embodiments of this invention a resistive silicide material is formed on side walls of Si fins, followed by removal of the remaining Si material of the fins leaving behind what will be referred to "resistive silicide fins". This procedure enables the resulting resistors to be integrated with very tight FinFET dimensions. In the embodiments of this invention a desired resistance value can be accurately established by, for example, the choice of the silicide material, the number of contacted resistive silicide fins, the length between contacts, as well as by, to a certain degree, the fin height.

FIG. 1 shows what can be referred to as a starting or initial structure comprised of a Si substrate 10 having a plurality of fins 12 formed on a top surface thereof The Si substrate 10 can have any desired thickness and can be, for example, a <100>Si substrate. Although four fins 12 are shown in FIG. 1 in practice there could be any desired number. The fins 12 can be formed, as one non-limiting example, by selectively masking a top surface of the substrate 10 and then removing (e.g., wet chemical etching) non-masked substrate material to leave the fins 12 protruding from a resultant (recessed) top surface of the substrate 10. Prior to etching a layer of hardmask (HM) material (e.g., a nitride such as $Si_3N_4$ or $SiO_xN_y$) is deposited to a desired thickness (e.g., 10 nm-30 nm) on the surface of the bulk Si substrate thereby leaving, after the etch, a protective HM cap 14 on a top of each defined fin 12. After forming the fins 12 an oxide layer is deposited, such as by CVD, and subsequently partially removed to leave a layer of what may be referred to as shallow trench isolation (STI) 16 on the recessed surface of the substrate 10 between the fins 12.

As non-limiting examples the fin width (W) can be in a range of about 6nm to about 12 nm and the fin pitch (P, the distance between fins measured in this non-limiting case between opposing fin sidewalls) can be in a range of about 25 nm to about 60 nm. The fin height (H, measured from the top surface of the STI 16) can be in a range of about 30 nm to about 60 nm. This implies that the original fin height (prior to the STI oxide being deposited) and the thickness of the resulting STI layer 16 are adjusted relative to one another to achieve the desired final fin height. The fin length (into the drawing page) can have any desired value and can depend on a desired resistance value. One exemplary length is about 1000 nm.

Figure 2:
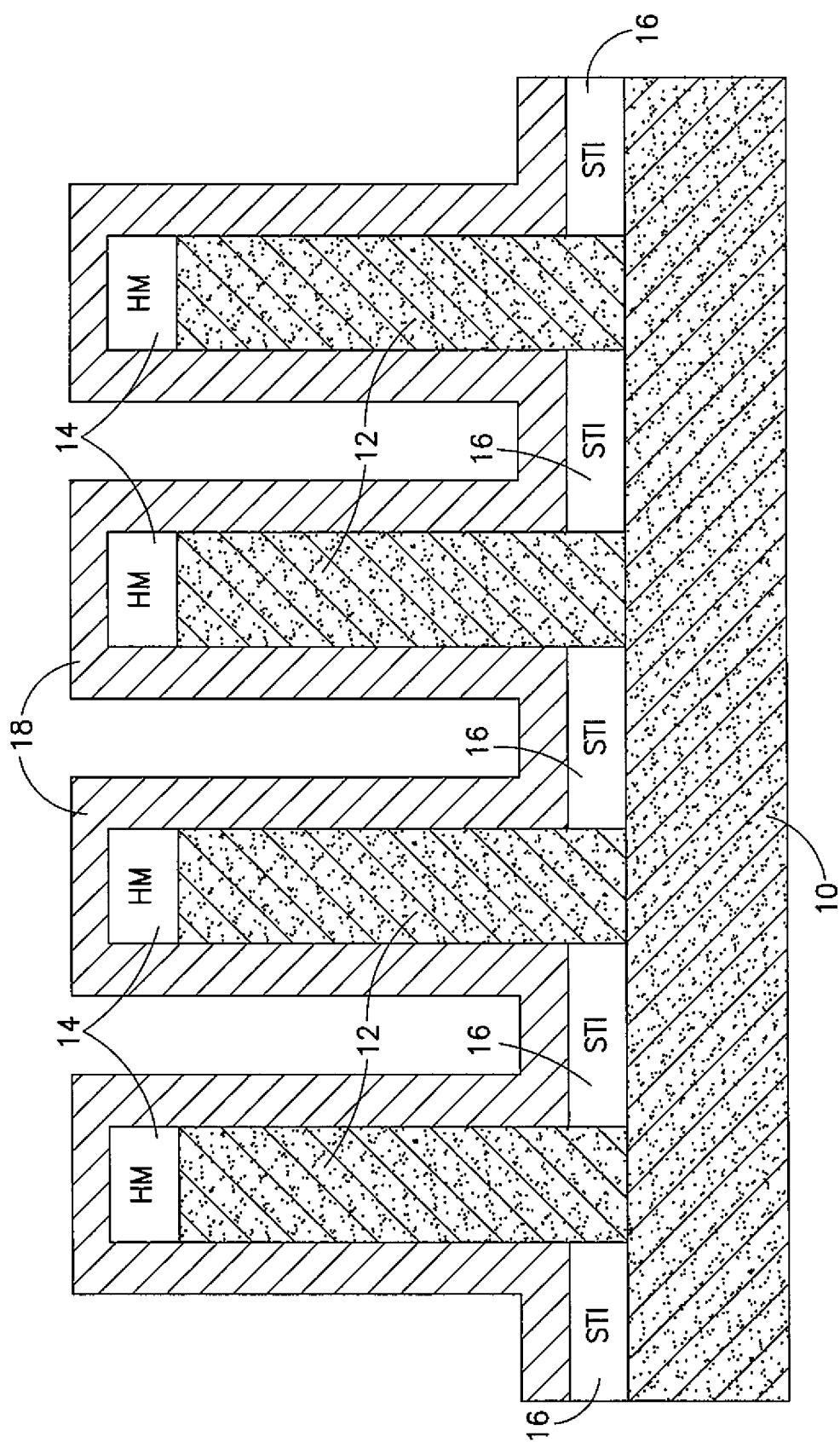

FIG. 2 shows the structure of FIG. 1 after a metal layer 18 is conformally deposited using, for example, atomic layer deposition (ALD) or physical vapor deposition (PVD) over the surfaces of the exposed structures (i.e., over the STI 16, the HM 14 and the sidewalls of the fins 12). The metal is selected as one that will form a desired resistive silicide with the exposed Si sidewalls of the fins 12. Non-limiting examples of suitable metals include Ni, Co, Ti, Pt, Ta, Hf, Nb and Zr. The metal and the metal thickness are selected based on several factors, including the fin pitch, the desired final resistance value and the metal-to-metal/silicide volume expansion. For example, the metal-to-metal/silicide volume expansion of Ni is 2.1.

Figure 3:
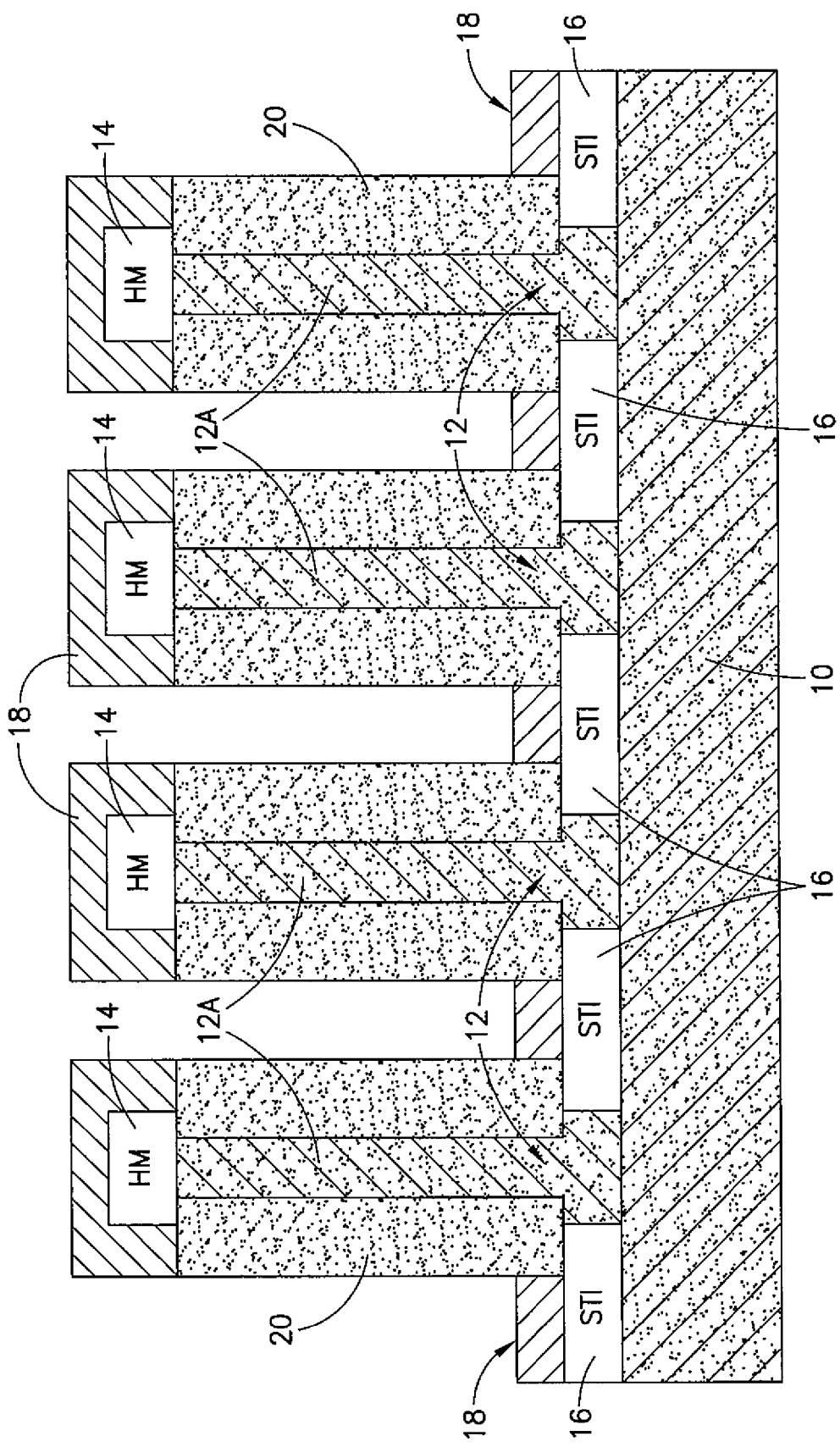

FIG. 3 shows the structure of FIG. 2 after performing a thermal salicidation process to convert that portion of the metal layer 18 that is in contact with the Si sidewalls of the fins 12 to a resistive silicide. As one non-limiting example the silicide anneal process can be conducted at about 420° C. for a period of time in a range of about 5 min-10 min. The resulting resistive silicide structures 20 can be referred to after subsequent processing as resistive silicide fins.

Using the example of the Ni metal layer 18, and assuming a fin width of about 8 nm, the Ni-silicide layer 20 will have a thickness of about 4 nm on each side of the fin 12 leaving a central unconsumed portion of the Si fin 12A (between the resistive silicide structures 20) of about 4 nm thickness. In this example about 2 nm of the Ni metal layer 18 is consumed and the remaining unreacted metal is stripped as shown in FIG. 4.

Figure 10:
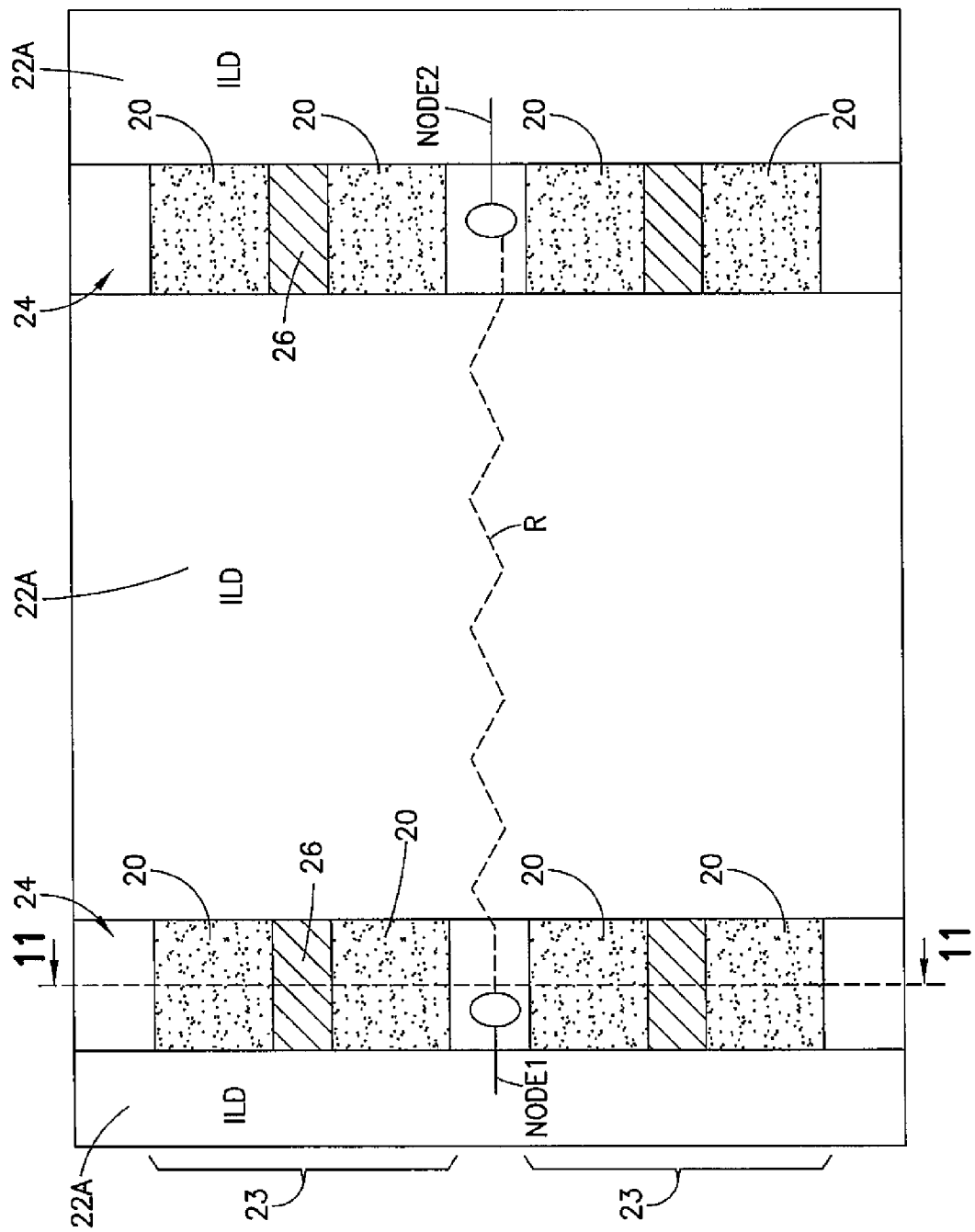
Figure 12:
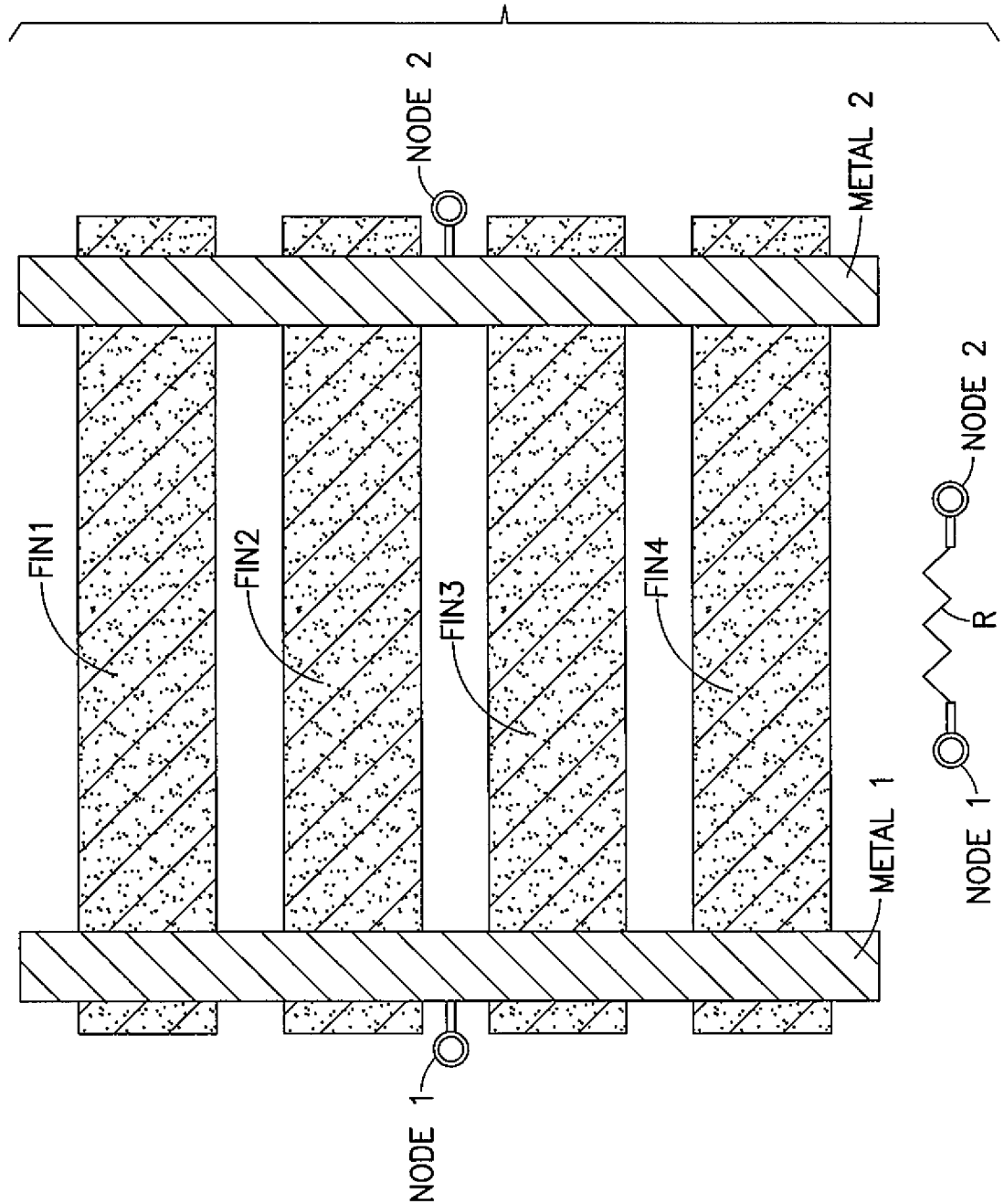

Continuing with this non-limiting example, the resistive value of a Ni-silicide fin (resistive silicide fin) formed in accordance with this method, and assuming a width of 4 nm, a fin height of 35 nm, a NiSi resistivity of 15 μΩ-cm and a fin length between two contacts (shown in FIGS. 10 and 12) of 100 nm, the N-silicide resistance is equal to about 107Ω (for each contacted fin). As is shown in FIGS. 10 and 12 two or more of the Ni-silicide fins can be connected in parallel to form one resistor R.

To obtain higher resistance values the fin length could be about 1000 nm or greater, and multiple fins can be used as one resistor, e.g., 100 fins 10 kΩ. In such a case, and further by example, multiple individual fins could be series connected end-to-end to increase the resistance value.

Figure 4:
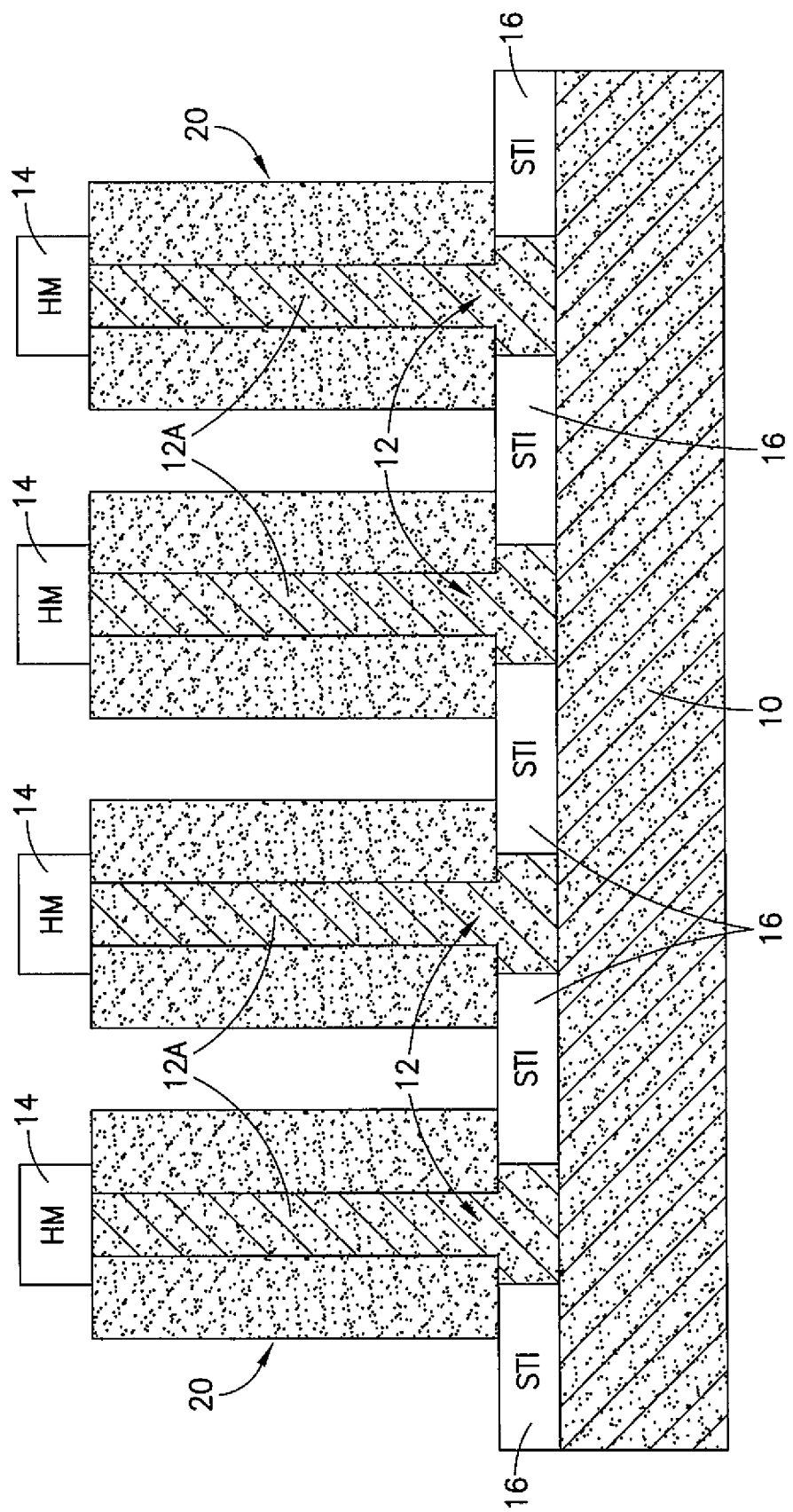

FIG. 4 shows the structure of FIG. 3 after performing a metal strip process to remove all of the unreacted metal 18. The metal strip can use any suitable process compatible with the deposited metal 18 including a wet chemical etch. As an example, for the case of Ni a solution of HF or HF/HNO$_3$ can be used for the metal strip process.

Figure 5:
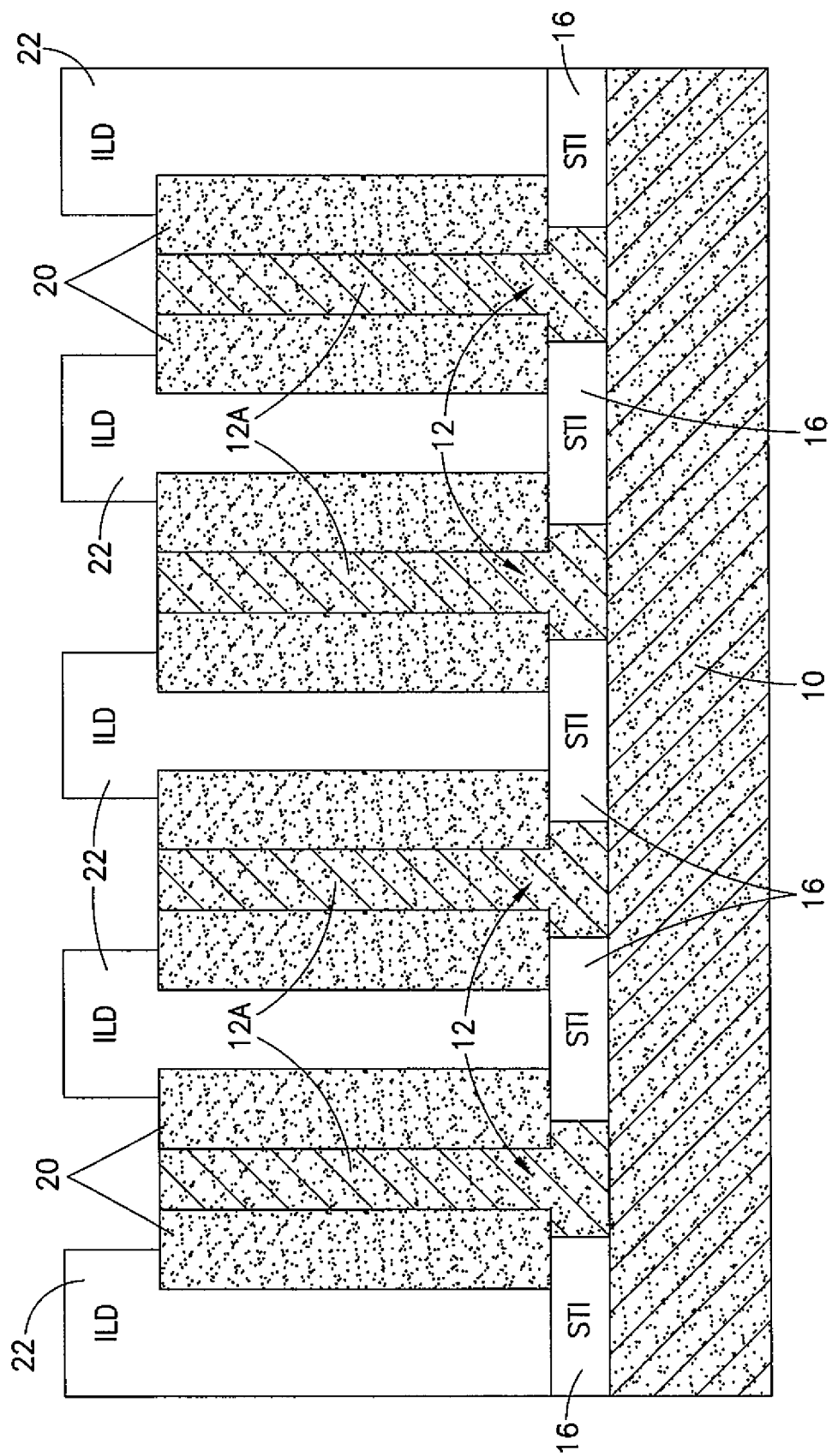

FIG. 5 shows the structure of FIG. 4 after performing several processing steps that are configured to: form a dielectric layer (an inter-layer dielectric (ILD) 22; perform an ILD chemical mechanical polish (CMP) process that stops on the top surface of the HM 14 so as to remove excess ILD material; and remove the HM caps 14. The ILD deposition can be performed by any suitable process including, as non-limiting examples, CVD and plasma-enhanced CVD (PECVD). The HM 18 can be removed by any suitable process specific to the HM material and selective to the ILD 22 and the resistive silicide 20, including a wet etch process and a dry etch process.

Figure 6:
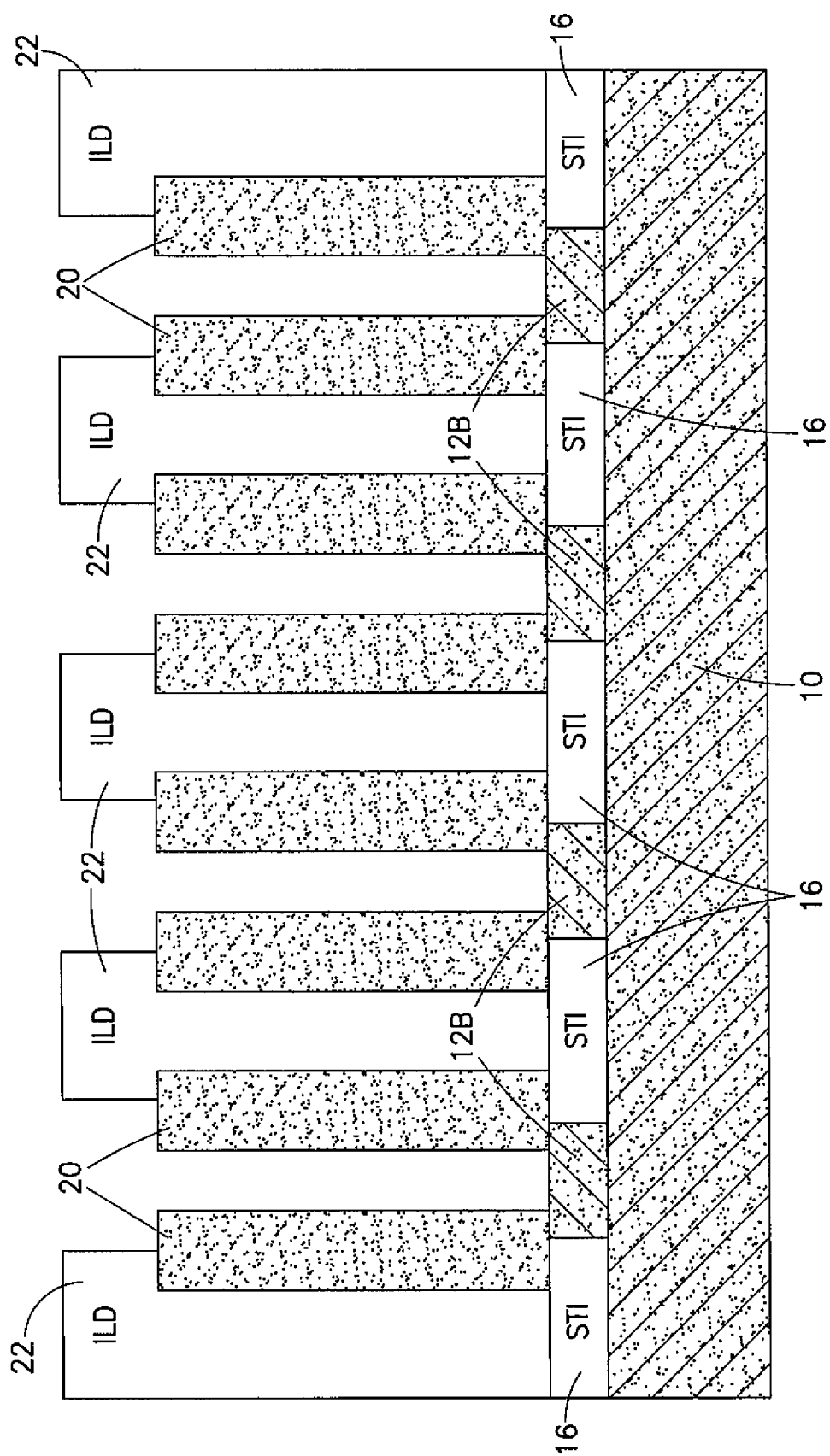

FIG. 6 shows the structure of FIG. 5 after removal of the remaining portion of the Si fins 12 using, for example, a wet etch or a reactive ion etch (RIE). The removal of the remaining portion of the fins 12 leaves what may be referred to as a fin bottom or a fin 'stump' or 'stub' 12B that lies between the STI 16 and partially beneath the resistive silicon fins 20.

Figure 7:
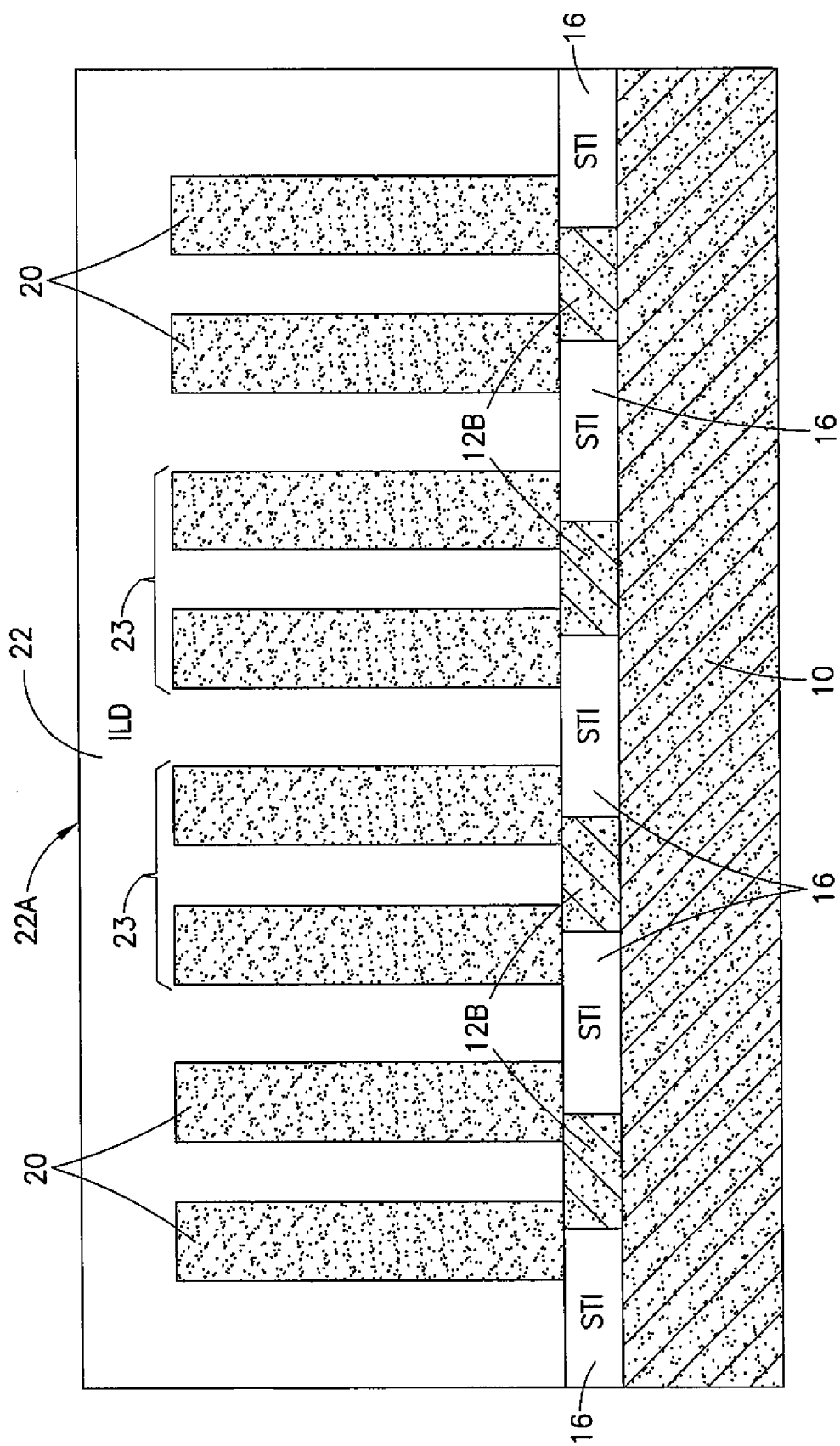

FIG. 7 shows the structure of FIG. 6 after additional ILD material is deposited to fill the voids left by the removal of the Si fins 12 in FIG. 6. The ILD has a top surface indicated as 22A. The structure at this point represents an array comprised of a plurality of linear resistive silicide fins 20 that are disposed in parallel. The resistive silicide fins 20 may be considered to be arranged in adjacent pairs 23 of resistive silicide fins 20, where the spacing between opposing adjacent inner sidewalls of the two fins of a pair 23 is about equal to the width of the unconsumed Si of the precursor Silicon fin 12 after the silicide process is completed. In this structure an outside sidewall of a resistive silicide fin 20 of a first pair 23 is spaced apart from an opposing outside sidewall of a resistive silicide fin 20 of an adjacent pair 23 by a distance about equal to the pitch (P) dimension shown in FIG. 1.

Figure 8:
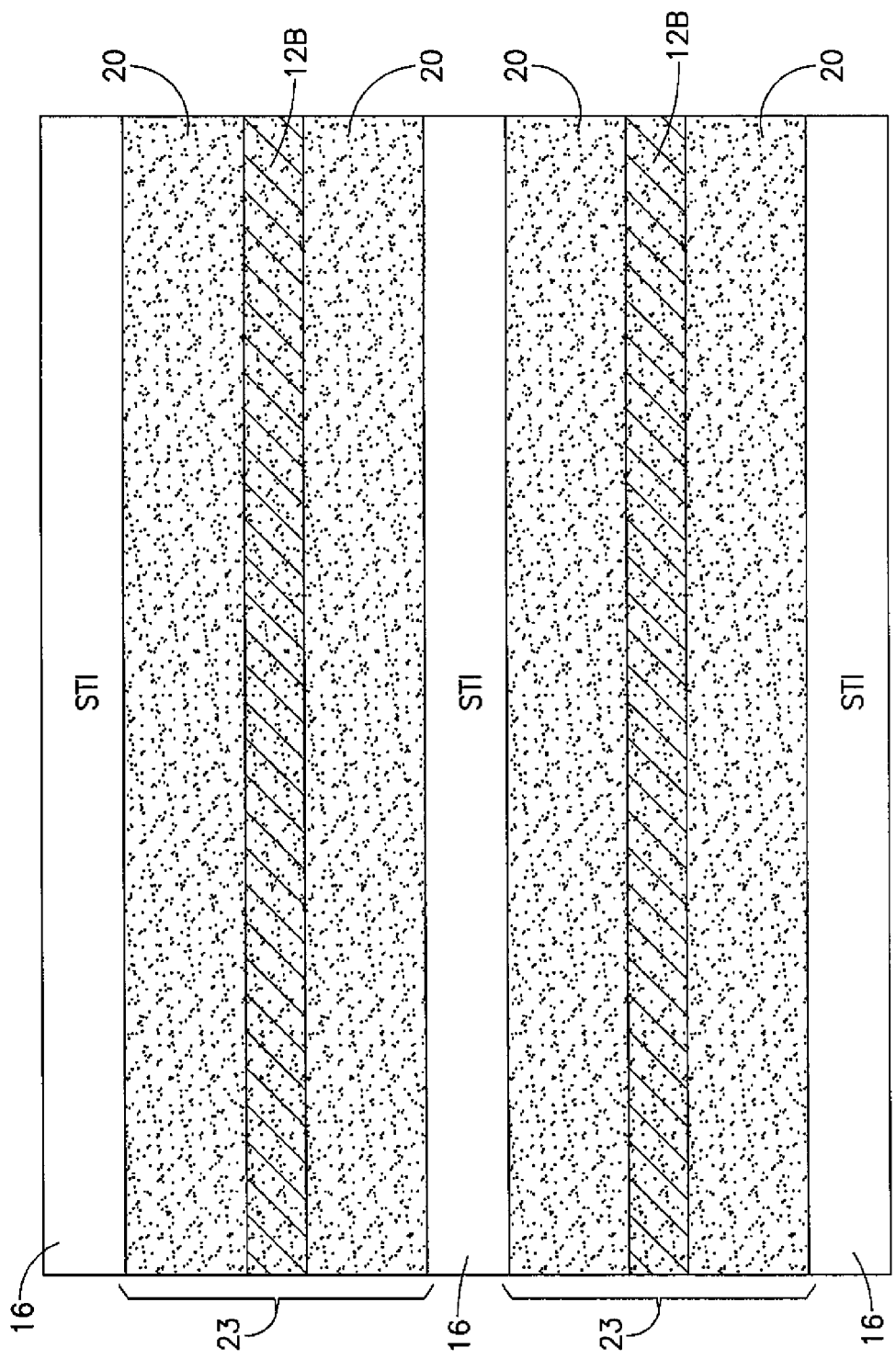
FIGS. 8, 9, 10 and 12 are each an enlarged top view. More specifically.

FIG. 8 is an enlarged top view of a portion of the structure shown in FIG. 7 looking 'through' the top surface 23 of the ILD 22 as though the ILD were not present. In FIG. 8 only the two inner-most fin pairs 23 are illustrated with the adjacent STI 16 fin bottoms 12B.

Figure 9:
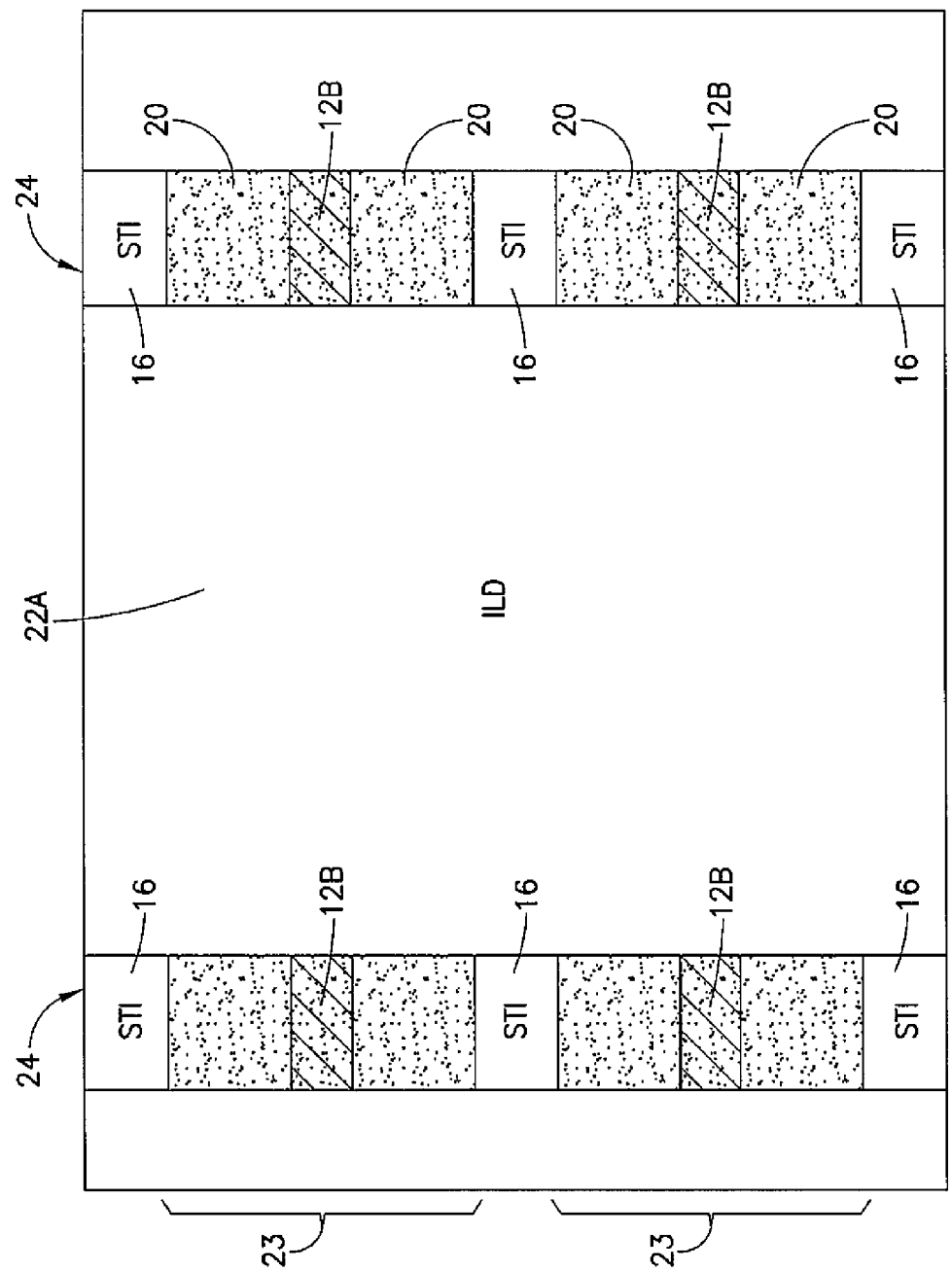

FIG. 9 is an enlarged top view of the portion of the structure shown in FIG. 7 looking down on the top surface 23 of the ILD 22. FIG. 9 assumes that a contact mask has been applied followed by contact trenches 24 being opened through the ILD 22 to expose the underlying portions of the STI 16, fin bottoms 12B and the resistive silicide fins 20. The contact trenches 24 can be formed, for example, by the use of a wet chemical etch that removes the ILD material while being selective to the material of the STI 16, the Si fin bottoms 12B and the resistive silicide fins 20. Although not shown in FIG. 9, in practice the ends of the contact trenches 24 can be arranged to fall within the width of underlying fin bottoms 12B, e.g., about at the mid-point of the width of the Si fin bottoms 12B. The mask used to form the contact trenches 24 is subsequently removed.

FIG. 10 is an enlarged top view of the portion of the structure shown in FIG. 9 after deposition of a desired contact metal/metal system 26 on the portions of the STI 16, the Si fin bottoms 12B and the resistive silicide fins 20 exposed within the contact trenches 24. Preferably at least two (one pair) of the resistive silicide fins 20 are electrically connected together by the contact metal 26. A low resistivity contact metal/metal system can be used as a low resistivity gap fill material including, for example, at least one of TiN, W, Al, Co and Ru. In addition, TiN and TaN, as two examples, could be used in some embodiments as liner/barrier materials.

Figure 11:
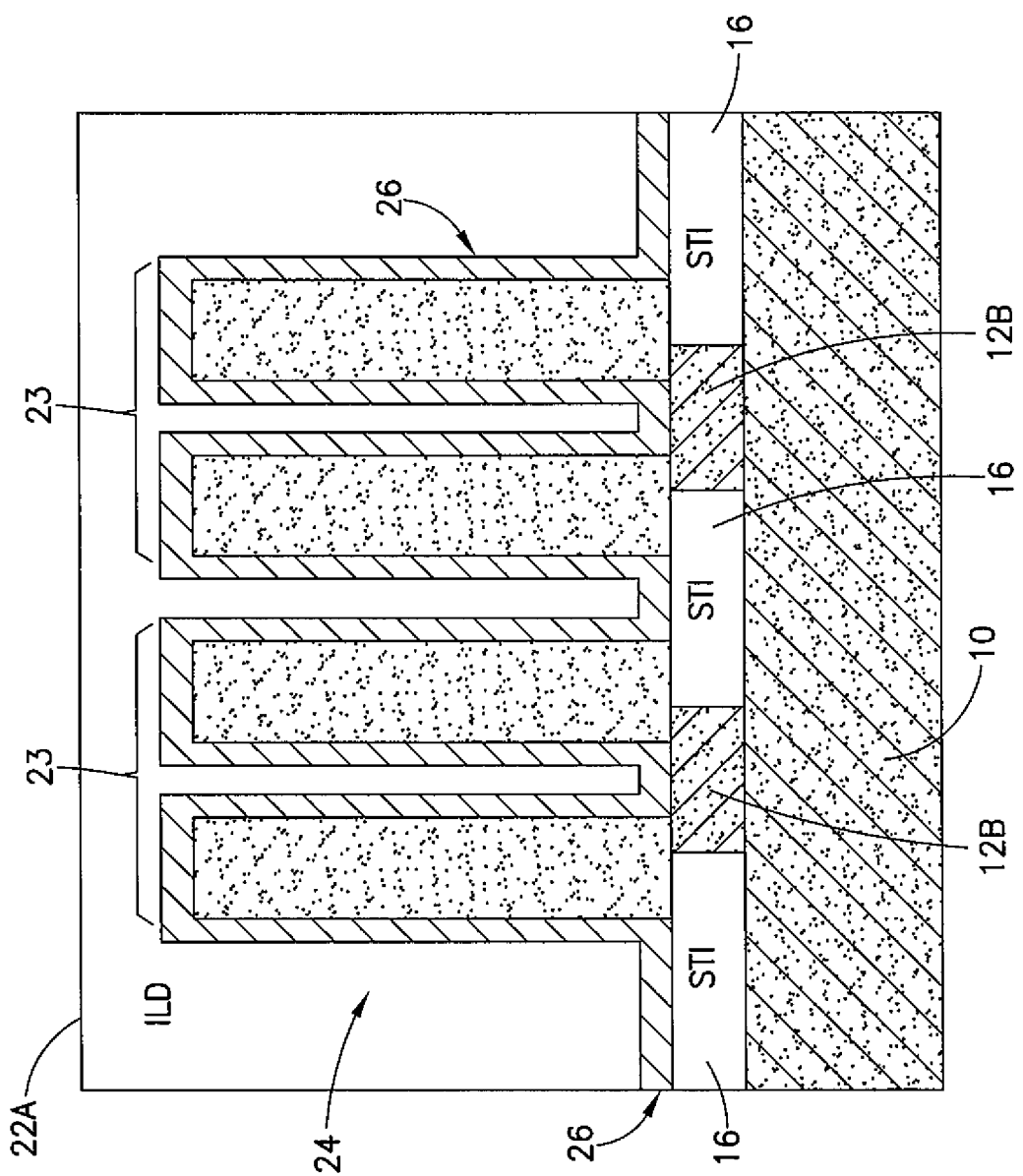

FIG. 11 is an enlarged cross-sectional view of the portion of the structure shown in FIG. 10, taken along the section line labeled '11' in FIG. 10. In this non-limiting example four of the resistive silicide fins 20 (two adjacent fin pairs 23) are electrically connected together by the contact metal 26.

FIG. 12 is an enlarged, simplified top view of a portion of the structure shown in FIG. 9 where a plurality of the resistive silicide fins 20 (Fin 1- Fin 4, two fin pairs 23) are connected in parallel by the contact metal 26 arranged as two metal strips (Metal 1 and Metal 2) to form a resistor (R).

Referring again also to FIG. 10, connecting two metallized regions together at what are referred to as Nodes 1 and 2 forms the two terminal resistor device R, shown schematically with a dashed line in FIG. 10, having opposing ends defined by the Nodes 1 and 2. In this non-limiting example there are four resistive silicide fins 20 connected in parallel, each having some length and a height between adjacent strips of contact metal 26. In other embodiments more or less than four fins can be connected in parallel, depending on the desired resistance value, the resistivity of the selected silicide, the fin length between metal contact strips and other factors as described. The resistors fabricated in accordance with the embodiments of this invention can be said to have a tight pitch since each resistive silicide fin 20 of a fin pair are separated by a distance given by the width of the removed, unsilicided portion of one of the original Si fins 12.

The Nodes 1 and 2 can be interconnected into a desired circuit configuration formed during additional conventional processing that fabricates, for example, FinFETs having gate contacts and SID contacts. Back end of line (BEOL) dielectric can be added along with vertical and horizontal conductive interconnects that are fabricated as is known in the art in order to connect the FinFET with other FinFETs, and with the resistor(s) (R) fabricated in accordance with this invention, thereby forming the desired circuit configuration (s).

It can be noted that the Si fins 12 that will be converted into the resistors R can be defined in the Si substrate at the same time that Si fins that will be used for FinFETs are defined, thereby overlapping and performing in parallel at least a portion of the passive and active device fabrication steps.

As was noted previously, the use of this invention enables the fabrication of resistors to be integrated with very tight FinFET dimensions. In the embodiments of this invention the desired resistance value can be accurately established by, for example, the choice of the silicide material 20, the number of contacted resistive silicide fins, the length of the resistive silicide fins between the contacts 26, as well as by, to a certain degree, the fin height.

It is also pointed out that any one of the structures shown in FIGS. 1-12 could be viewed as an intermediate structure formed during the overall passive device fabrication process.

Integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent fabrication processes including deposition processes and etching processes may be used by those skilled in the art. Further, the exemplary embodiments are not intended to be limited to only those semiconductor materials, metals, insulators, layer thicknesses, dimensions and the like that were specifically disclosed above. Any and all modifications of the teachings of this invention will still fall within the scope of this invention.

What is claimed is:

1. A structure, comprising:
    a substrate having a top surface;
    a dielectric layer disposed on the top surface; and
    an array of linear resistive silicide fin structures extending upwardly perpendicular to the top surface and overlying a portion of a top surface of the dielectric layer, wherein individual ones of the linear resistive silicide fin structures are disposed parallel to one another;
    where two adjacent linear resistive silicide fin structures also overly a portion of a Si fin stump that is disposed in and surrounded by the dielectric layer on the top surface of the substrate;
    where linear resistive silicide fin structures of a pair of linear resistive silicide fin structures are spaced apart from one another by a distance about equal to a width of a removed unsilicided central portion of a precursor semiconductor fin structure, where the Si fin stump comprised a portion of the precursor semiconductor fin structure.

2. The structure as in claim 1, further comprising a first electrically conductive contact disposed on at least two adjacent linear resistive silicide fin structures at a first location.

3. The structure as in claim 2, further comprising a second electrically conductive contact disposed on the at least two adjacent linear resistive silicide fin structures at a second location that is spaced away from the first location by a predetermined length.

4. The structure as in claim 3, where a resistor device is defined by the material of the linear resistive silicide fin structures between the first and second electrically conductive contacts, where a resistance value of the resistor device is related to a type of silicide, a number of contacted adjacent linear resistive silicide fin structures and the predetermined length.

5. The structure as in claim 4, where the resistance value of the resistor device is further related to a height of the linear resistive silicide fin structures defined by a distance from the top surface of the layer of dielectric material to a top of the linear resistive silicide fin structures.

6. The structure as in claim 1, where a two terminal resistor device is defined at least in part by at least two of the linear resistive silicide fin structures connected in parallel.

7. The structure as in claim 1, where a two terminal resistor device is defined at least in part by at least two of the linear resistive silicide fin structures connected in series.

8. A structure, comprising:
    a substrate having a top surface;
    a dielectric layer disposed on the top surface; and an array of linear resistive silicide fin structures extending upwardly perpendicular to the top surface and overlying a portion of a top surface of the dielectric layer, wherein individual ones of the linear resistive silicide fin structures are disposed parallel to one another;

where two adjacent linear resistive silicide fin structures also overly a portion of a Si fin stump that is disposed in and surrounded by the dielectric layer on the top surface of the substrate;

further comprising a first electrically conductive contact disposed on at least two adjacent linear resistive silicide fin structures at a first location;

further comprising a second electrically conductive contact disposed on the at least two adjacent linear resistive silicide fin structures at a second location that is spaced away from the first location by a predetermined length;

where a resistor device is defined by the material of the linear resistive silicide fin structures between the first and second electrically conductive contacts, where a resistance value of the resistor device is related to a type of silicide, a number of contacted adjacent linear resistive silicide fin structures and the predetermined length.

9. The structure as in claim 8, where the resistance value of the resistor device is further related to a height of the linear resistive silicide fin structures defined by a distance from the top surface of the layer of dielectric material to a top of the linear resistive silicide fin structures.

10. The structure as in claim 8, where linear resistive suicide fin structures of a pair of linear resistive silicide fin structures are spaced apart from one another by a distance about equal to a width of a removed unsilicided central portion of a precursor semiconductor fin structure, where the Si fin stump comprised a portion of the precursor semiconductor fin structure.

11. The structure as in claim 8, where a two terminal resistor device is defined at least in part by at least two of the linear resistive silicide fin structures connected in parallel.

12. The structure as in claim 8, where a two terminal resistor device is defined at least in part by at least two of the linear resistive silicide fin structures connected in series.

* * * * *